United States Patent
Onoda

(10) Patent No.: US 10,715,912 B2
(45) Date of Patent: Jul. 14, 2020

(54) WIRELESS COMMUNICATION DEVICE, AUDIO SIGNAL CONTROLLING METHOD, AND NON-TRANSITORY COMPUTER-READABLE STORAGE MEDIUM

(71) Applicant: JVCKENWOOD Corporation, Yokohama-shi, Kanagawa (JP)

(72) Inventor: Tatsuya Onoda, Yokohama (JP)

(73) Assignee: JVCKENWOOD Corporation, Yokohama-shi (JP)

( * ) Notice: Subject to any disclaimer, the term of this patent is extended or adjusted under 35 U.S.C. 154(b) by 0 days.

(21) Appl. No.: 16/523,641

(22) Filed: Jul. 26, 2019

(65) Prior Publication Data

US 2020/0037072 A1 Jan. 30, 2020

(30) Foreign Application Priority Data

Jul. 27, 2018 (JP) ................... 2018-140880

(51) Int. Cl.
*G10L 25/60* (2013.01)
*G10L 25/69* (2013.01)
*H04R 3/04* (2006.01)
*H03G 5/16* (2006.01)

(52) U.S. Cl.
CPC ............. *H04R 3/04* (2013.01); *G10L 25/60* (2013.01); *G10L 25/69* (2013.01); *H03G 5/165* (2013.01)

(58) Field of Classification Search
None
See application file for complete search history.

(56) References Cited

U.S. PATENT DOCUMENTS

| | | | | |
|---|---|---|---|---|
| 5,915,235 A * | 6/1999 | DeJaco | ............... | G10L 21/0364 704/203 |
| 2007/0150262 A1* | 6/2007 | Mori | ..................... | G10L 19/167 704/201 |
| 2009/0287480 A1* | 11/2009 | Mapes-Riordan | ...... | G10L 19/26 704/225 |

FOREIGN PATENT DOCUMENTS

JP 2009-118119 A 5/2009

* cited by examiner

*Primary Examiner* — James K Mooney
(74) *Attorney, Agent, or Firm* — Procopio, Cory, Hargreaves & Savitch LLP

(57) ABSTRACT

A wireless communication device includes an equalizer configured to adjust a frequency characteristic of a user audio signal on the basis of a predetermined gain setting and to generate an adjusted signal, or an adjusted audio signal; an encoder configured to encode the adjusted signal with a preset scheme to generate an encoded signal; a decoder configured to decode the encoded signal to generate a decoded signal; a sound quality evaluator configured to carry out a PESQ evaluation of the decoded signal and to generate an evaluation result with the user audio signal serving as a reference signal for evaluation; and a selector configured to change the gain setting and to select a gain setting yielding a high evaluation result.

9 Claims, 5 Drawing Sheets

WIRELESS COMMUNICATION DEVICE, AUDIO SIGNAL CONTROLLING METHOD, AND NON-TRANSITORY COMPUTER-READABLE STORAGE MEDIUM

CROSS REFERENCE TO RELATED APPLICATION

This application is based upon and claims the benefit of priority from Japanese patent application No. 2018-140880, filed on Jul. 27, 2018, the disclosure of which is incorporated herein in its entirety by reference.

BACKGROUND

The present disclosure relates to wireless communication devices, audio signal controlling methods, and programs.

In wireless communication devices that exchange audio signals through wireless communication, an audio signal to be transmitted is encoded with a high compression rate, and thus the sound deteriorates upon being decoded. In order to allow a transmitted sound to have a high sound quality, a technique for controlling an audio signal has been proposed.

For example, Japanese Unexamined Patent Application Publication No. 2009-118119 describes a wireless microphone. This wireless microphone includes a microphone unit and a wireless transmission circuit provided in a microphone body. The wireless transmission circuit modulates an audio signal that has been subjected to electroacoustic conversion by the microphone unit into a wireless signal and transmits the wireless signal. A sound quality changeover switch is provided on the microphone body, and an equalizer is provided inside the microphone body. The equalizer determines the characteristics of an audio signal from the microphone unit in accordance with a changeover operation of the sound quality changeover switch and inputs the audio signal to the wireless transmission circuit.

However, the technique described in Japanese Unexamined Patent Application Publication No. 2009-118119 relies on a subjective view of the transmitter, and it is difficult to set the sound quality in consideration of surrounding noise and so on present when the sound is uttered. In addition, when the wireless communication device is used with an external microphone connected thereto, for example, the sound may deteriorate due to the characteristics of the external microphone. Aside from the above, there is a case in which the setting of the frequency characteristics of an audio signal may ought to be adjusted depending on the language used by the speaker. In this manner, there is a case in which a high sound quality cannot be maintained due to various conditions under which the wireless communication device transmits an audio signal.

SUMMARY

A wireless communication device according to an embodiment is configured to perform transmission of a user audio signal and reception of a communicating party audio signal. The wireless communication device includes an equalizer configured to adjust a frequency characteristic of the user audio signal on the basis of a predetermined gain setting and to generate an adjusted signal, the adjusted signal being an adjusted audio signal; an encoder configured to encode the adjusted signal with a preset scheme to generate an encoded signal; a decoder configured to decode the encoded signal to generate a decoded signal; a sound quality evaluator configured to carry out a perceptual evaluation of speech quality (PESQ) evaluation of the decoded signal and to generate an evaluation result with the user audio signal serving as a reference signal for evaluation; and a selector configured to change the gain setting and to select a gain setting yielding a high evaluation result.

An audio signal controlling method according to an embodiment is for a wireless communication device configured to perform transmission of a user audio signal and reception of a communicating party audio signal. The audio signal controlling method includes an adjusted signal generating step of adjusting a frequency characteristic of the user audio signal on the basis of a predetermined gain setting and generating an adjusted signal, the adjusted signal being an adjusted audio signal; an encoding step of encoding the adjusted signal with a preset scheme to generate an encoded signal; a decoding step of decoding the encoded signal to generate a decoded signal; a sound quality evaluating step of carrying out a PESQ evaluation of the decoded signal and generating an evaluation result with the user audio signal serving as a reference signal for evaluation; and an updating step of changing the gain setting and selecting a gain setting yielding a high evaluation result.

The present embodiments can provide a wireless communication device and an audio signal control method that suppress deterioration of the transmission sound quality with ease.

BRIEF DESCRIPTION OF THE DRAWINGS

The above and other aspects, advantages and features will be more apparent from the following description of certain embodiments taken in conjunction with the accompanying drawings, in which.

DETAILED DESCRIPTION

Figure 1:
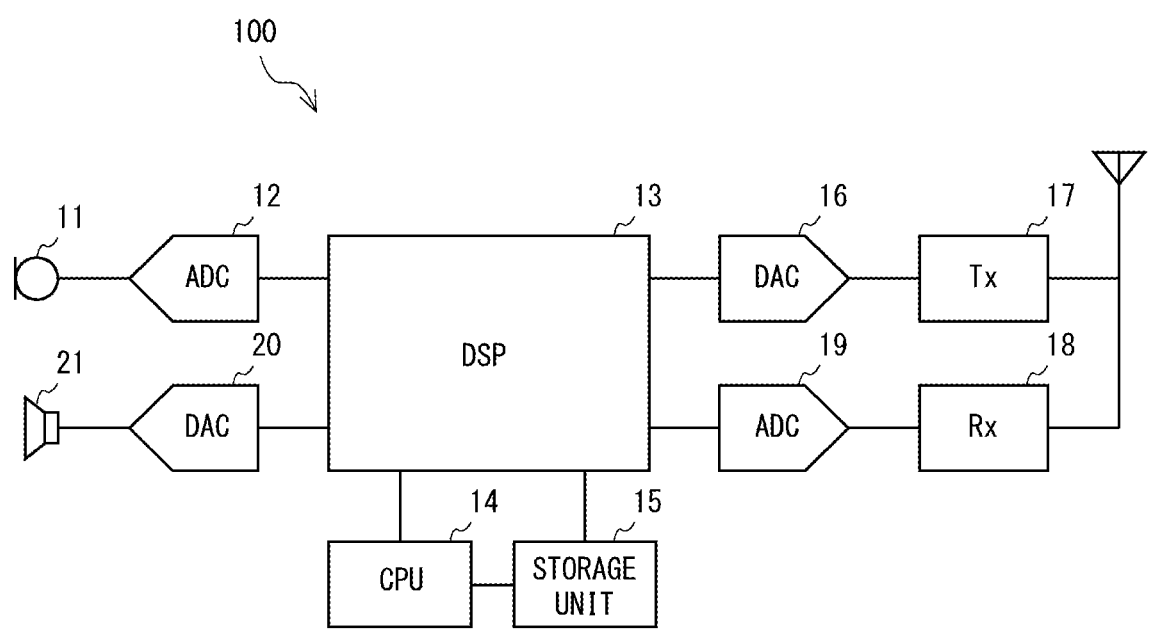
FIG. 1 is a schematic diagram illustrating a configuration of a wireless communication device according to a first embodiment.

To make the description clearer, the drawings described hereinafter include omissions and simplification as appropriate. In the drawings, identical elements are given identical reference characters, and their duplicate descriptions will be omitted as necessary.

First Embodiment

Hereinafter, embodiments of the present disclosure will be described with reference to the drawings. FIG. 1 is a schematic diagram illustrating a configuration of a wireless communication device according to a first embodiment. A wireless communication device 100 carries out communication of a half-duplex communication system and transmits a user's utterance to a communicating party upon being triggered by an operation on the push-to-talk (PTT) or the like. The wireless communication device 100 is what is known as a digital radio set. The wireless communication device 100 is used, for example, as a land mobile radio (LMR). Specifically, the wireless communication device 100 transmits an audio signal from the user (referred to as a user audio signal) and receives an audio signal from a communicating party (referred to as a communicating party audio signal). The wireless communication device 100 according to the present embodiment executes an audio signal control process for suppressing a decrease in the sound quality of a user audio signal.

The wireless communication device 100 includes, as main components, a microphone 11, an analog-to-digital (AD) converter 12, a digital signal processor (DSP) 13, a central processing unit (CPU) 14, a storage unit (storage circuit) 15, a digital-to-analog converter 16, a transmission circuit 17, a reception circuit 18, an AD converter 19, a DA converter 20, and a speaker 21.

The microphone 11 collects a user's utterance, converts the collected sound to an analog signal, and supplies the analog signal to the AD converter 12. The AD converter 12 converts the analog signal received from the microphone 11 into a digital signal and supplies the converted digital signal to the DSP 13.

The DSP 13 is an arithmetic unit that carries out various types of signal processing. For example, the DSP 13 includes an encoder and a decoder. The encoder encodes a digital signal with a preset scheme, and the decoder decodes an encoded signal.

The wireless communication device 100 employs Advanced Multi-Band Excitation+2 (AMBE(registered trademark)+2) for its speech compression system. Thus, the DSP 13 encodes a digital signal received as a signal to be transmitted in compliant with an AMBE+2 scheme. Alternatively, the DSP 13 decodes a received digital signal in compliant with an AMBE+2 scheme.

Specifically, the DSP 13 encodes a digital signal (user audio signal) received from the AD converter 12 with the aforementioned scheme and supplies the encoded signal to the DA converter 16. In addition, the DSP 13 decodes a digital signal received from the AD converter 19 with the aforementioned scheme and supplies the decoded signal to the DA converter 20. The DSP 13 is also provided with a function of decoding a signal encoded by the encoder.

The DSP 13 is connected to the CPU 14 as well and carries out various processes in response to an instruction from the CPU 14. The DSP 13 is connected also to the storage unit 15. The DSP 13 receives a predetermined signal stored in the storage unit 15 and carries out various processes on the received signal. More specific processes of the DSP 13 will be described later.

The CPU 14 is an arithmetic unit that carries out various types of signal processing. The CPU 14 is connected to the DSP 13 and transmits an instruction for the processes to be carried out by the DSP 13. The CPU 14 is connected also to the storage unit 15. The CPU 14 retrieves predetermined information from the storage unit 15 and/or writes predetermined information into the storage unit 15.

The storage unit 15 is a nonvolatile rewritable storage device, such as a flash memory, an erasable programmable read-only memory (EPROM), or a solid state drive. The storage unit 15, for example, receives an audio signal from the DSP 13 and stores the received audio signal. In addition, the storage unit 15 supplies a stored audio signal to the DSP 13 as appropriate.

The DA converter 16 receives a digital signal from the DSP 13, converts the received digital signal to an analog signal, and supplies the converted analog signal to the transmission circuit 17. The transmission circuit 17 carries out a modulation process and so on for transmitting the analog signal received from the DA converter 16 to a communicating party and supplies the resulting signal to an antenna.

The reception circuit 18 carries out a process of demodulating a signal (communicating party audio signal) received via the antenna and supplies an analog signal to the AD converter 19. The AD converter 19 converts the analog signal received from the reception circuit 18 to a digital signal and supplies the converted digital signal to the DSP 13.

The wireless communication device 100 may be pre-equipped with the microphone 11, or the microphone 11 may be a desired microphone connected to the wireless communication device 100 via a connector (not illustrated). Naturally, a circuit, such as an amplifier circuit, a high-pass filter, or a low-pass filter, for processing an analog signal as appropriate is provided between the microphone 11 and the AD converter 12. In a similar manner, a predetermined circuit is provided between the speaker 21 and the DA converter 20.

Figure 2:
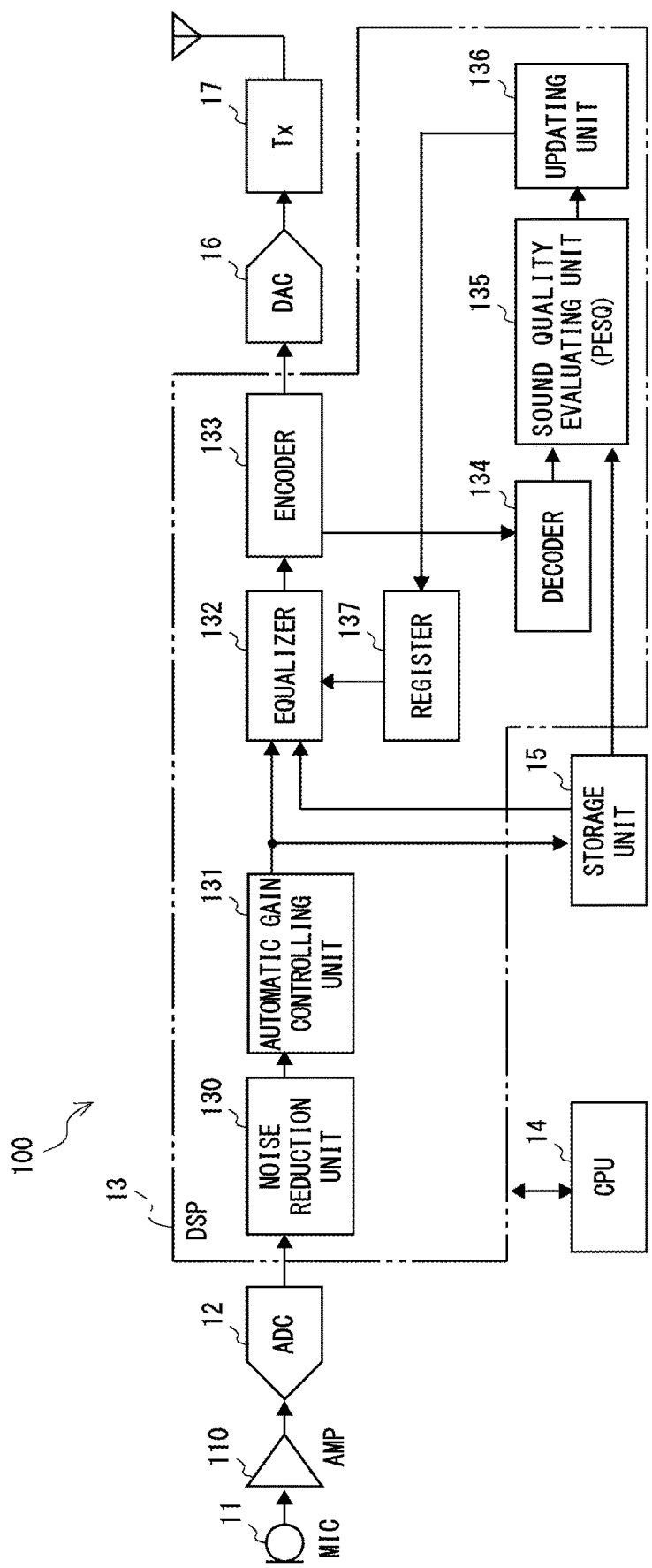
FIG. 2 is a functional block diagram of the wireless communication device according to the first embodiment.

Next, with reference to FIG. 2, a configuration for implementing an audio signal controlling method carried out by the wireless communication device 100 according to the present embodiment will be described. FIG. 2 is a functional block diagram of the wireless communication device according to the first embodiment. As described above, the wireless communication device 100 includes, for example, an amplifier 110 provided between the microphone 11 and the AD converter 12. The amplifier 110 amplifies a signal received from the microphone 11 to a predetermined level and supplies the amplified signal to the AD converter 12.

The DSP 13 includes a noise reduction unit 130, an automatic gain controlling unit 131, an equalizer 132, an encoder 133, a decoder 134, a sound quality evaluating unit (a sound quality evaluator) 135, an updating unit (selector) 136, and a register 137.

The noise reduction unit 130 analyzes a digital signal received from the AD converter 12, identifies a noise component from a soundless segment, and removes the noise component with a filter. The noise reduction unit 130 supplies a digital signal having a noise component removed therefrom to the automatic gain controlling unit 131.

The automatic gain controlling unit 131 feeds back a peak signal level to adjust the signal level to an appropriate range and supplies a signal having its signal level adjusted to the equalizer 132 and the storage unit 15.

The equalizer 132 has a function of raising and/or lowering the gain in each frequency band of a sound from an input audio signal in accordance with a predetermined gain setting to adjust the frequency characteristics of the sound and generating an adjusted signal, or an adjusted audio signal.

The gain setting is stored in the register 137. In the present embodiment, the equalizer 132 has a function of adjusting, for example, the gain in each of five frequency bands—a low band, a low-mid band, a mid band, a high-mid band, and a high band—in three levels-0 dB (decibel), +4 dB, and −4 dB. In other words, in this case, any one of the $5^3$ or 125 patterns of combinations is being reflected on the register 137.

Specifically, the equalizer 132 receives an audio signal from the automatic gain controlling unit 131 or the storage unit 15. The equalizer 132 then reads the setting of the register 137, and in accordance with the read setting, the equalizer 132 carries out the adjustment process described above, generates an adjusted signal, and supplies the generated adjusted signal to the encoder 133.

The encoder 133 receives the adjusted signal from the equalizer 132 and encodes the received adjusted signal to generate an encoded signal. The encoder 133 then supplies the generated encoded signal to the DA converter 16 or the decoder 134 or both.

The decoder 134 receives an encoded signal from the encoder 133 and decodes the received encoded signal to generate a decoded signal. The decoder 134 then supplies the generated decoded signal to the sound quality evaluating unit 135. In the present embodiment, the encoder 133 and the decoder 134 carry out the processes in compliant with AMBE+2 schemes, as described above.

The encoding scheme, AMBE+2, employed by the wireless communication device 100 encodes (compresses) an audio signal with a high compression rate. Therefore, a decoded (decompressed) audio signal deteriorates from the original audio signal. This deterioration of the audio signal may lead to a case in which the decoded audio signal has a sound quality that makes the audio signal less discernible to a communicating party. Accordingly, the wireless communication device 100 adjusts, with the equalizer 132, an audio signal that has not been encoded and encodes an adjusted signal. Thus, a decrease in the sound quality associated with encoding is suppressed.

The sound quality evaluating unit 135 has a function of carrying out evaluation by comparing an input audio signal for reference and an audio signal for evaluation and outputting an evaluation result. Specifically, the sound quality evaluating unit 135 carries out an evaluation through the perceptual evaluation of speech quality (PESQ). The PESQ is a technique for estimating a quality value from a difference between an audio signal for reference and an audio signal for evaluation. In the PESQ evaluation, an estimated quality value is output in the form of a value of from 1 to 5. Herein, the quality value being 1 means the lowest case, and the quality value being 5 means the highest case. When an input signal is incomplete and the sound quality evaluating unit 135 cannot calculate a correct evaluation result, the sound quality evaluating unit 135 may output, for example, 0 as a value indicating that the evaluation is not available.

The sound quality evaluating unit 135 receives, as an audio signal for reference, a user audio signal from the storage unit 15. The user audio signal supplied from the storage unit 15 is an audio signal that has been output from the automatic gain controlling unit 131 and is an audio signal corresponding to a predetermined duration that has been stored in the storage unit 15. The predetermined duration is, for example, 120 seconds.

The sound quality evaluating unit 135 receives, as an audio signal for evaluation, a decoded signal from the decoder 134. The decoded signal received from the decoder 134 at this point is a signal obtained by adjusting, with the equalizer 132, an audio signal identical to the one used as the audio signal for reference stored in the storage unit 15, by encoding this audio signal with the encoder 133, and by further decoding this audio signal with the decoder 134. In other words, the sound quality evaluating unit 135 carries out an evaluation by comparing a user audio signal that is not adjusted, not encoded, and not decoded and a signal obtained by adjusting, encoding, and decoding the user audio signal and outputs an evaluation result. The sound quality evaluating unit 135 generates, as an evaluation result, an identification code concerning the evaluation and the quality value of from 1 to 5 corresponding to the identification code and supplies the evaluation result to the updating unit 136.

Herein, the identification code concerning the evaluation is a code that uniquely corresponds to the gain setting of the equalizer 132 that has adjusted the user audio signal. The sound quality evaluating unit 135 carries out the evaluation with each of the different gain settings of the equalizer 132 and supplies the result of each evaluation to the updating unit 136. Therefore, the sound quality evaluating unit 135 generates the identification code for associating each gain setting of the equalizer 132 with a corresponding evaluation result.

The updating unit 136, upon receiving a plurality of evaluation results from the sound quality evaluating unit 135, updates the gain setting set in the register 137 on the basis of the received plurality of evaluation results. Specifically, for example, upon receiving the evaluation result of a first instance from the sound quality evaluating unit 135, the updating unit 136 stores this evaluation result. Then, the updating unit 136 supplies, to the register 137, a signal that yields a gain setting different from the gain setting of the first instance. The register 137 updates the gain setting on the basis of the signal received from the updating unit 136. Upon the gain setting being updated, a user audio signal is supplied again to the equalizer 132 from the storage unit 15, and the equalizer 132 generates an adjusted signal in accordance with the updated gain setting. Furthermore, the adjusted signal generated in accordance with the updated gain setting is encoded by the encoder 133 and decoded by the decoder 134 and is supplied to the sound quality evaluating unit 135. The sound quality evaluating unit 135 then carries out the evaluation by comparing the decoded signal generated in accordance with the updated gain setting and the user audio signal serving as an audio signal for reference and supplies the evaluation result to the updating unit 136. The updating unit 136 receives a plurality of evaluation results in this manner, and upon receiving a predetermined number of evaluation results, the updating unit 136 selects one evaluation result having a high quality value from the predetermined number of evaluation results and carries out a process of updating the value of the register 137 with the gain setting corresponding to the selected evaluation result. An algorithm for updating the gain setting may perform all the gain settings that can be set.

The updating unit 136 may have a function of, when the sound quality evaluating unit 135 has output 0 indicating that the evaluation is not available, stopping the process upon receiving 0.

As described above, the register 137 is a storage unit having the gain setting of the equalizer 132 stored therein and is, for example, a volatile storage device, such as a dynamic random-access memory (DRAM), or a nonvolatile storage device, such as a flash memory.

The CPU 14 communicates bidirectionally with the DSP 13 to provide an instruction, as appropriate, to each constituent element within the DSP 13. For example, the CPU 14 issues a trigger for starting an audio signal control process. Specifically, the CPU 14, under a predetermined condition, instructs that an audio signal be supplied from the storage unit 15 to the equalizer 132 and instructs the encoder 133 to supply an encoded signal to the decoder 134. With such instructions issued by the CPU 14, the series of processes carried out by the equalizer 132, the encoder 133, the decoder 134, the sound quality evaluating unit 135, and the updating unit 136 for updating the gain setting of the equalizer 132 is started. If the CPU 14 receives a communicating party audio signal from the communicating party while the series of processes described above is being carried out, the CPU 14 issues an instruction to suspend this series of processes. Then, the CPU 14 issues an instruction to resume this series of processes when the process for receiving the communicating party audio signal is finished.

Figure 3:
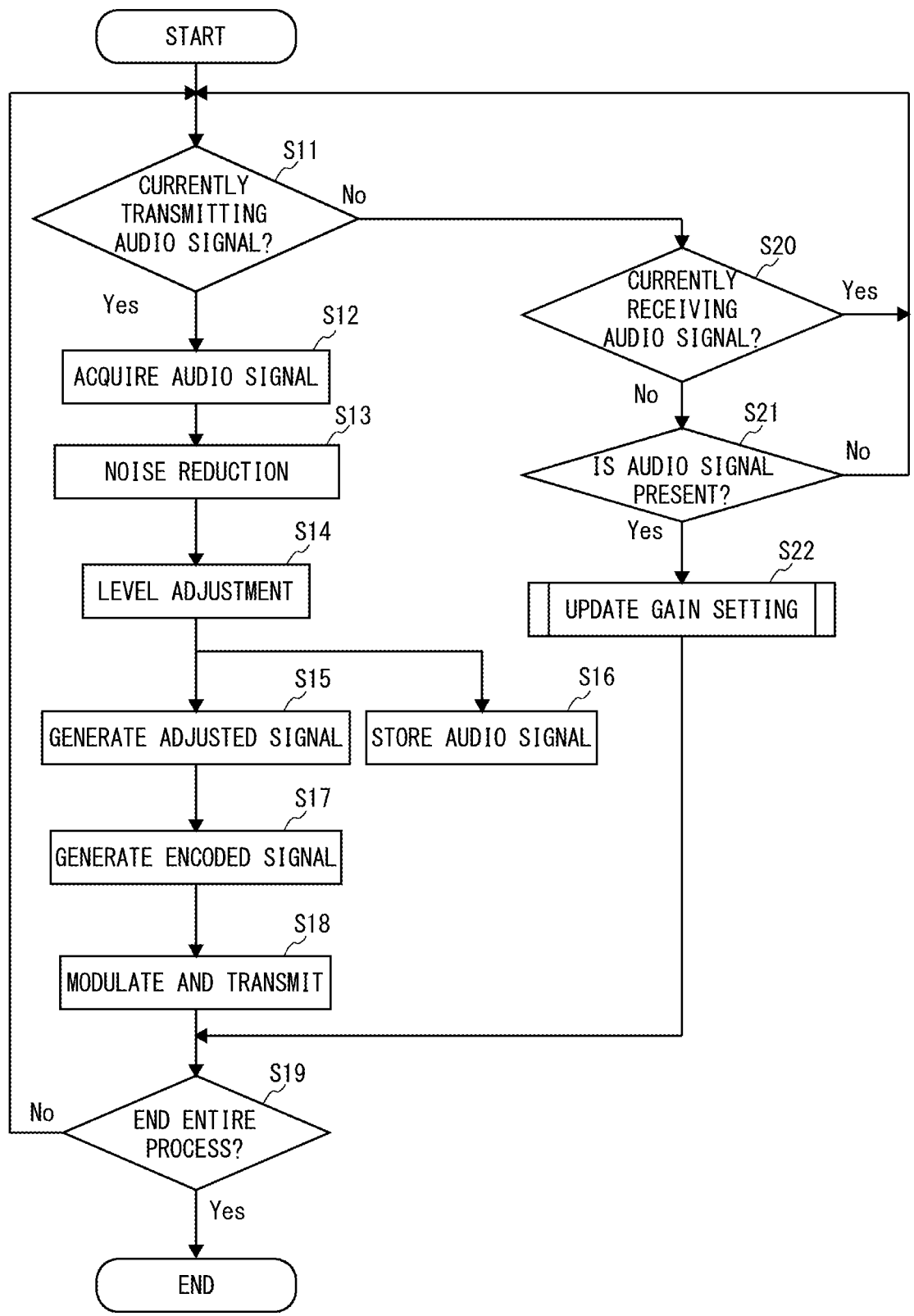
FIG. 3 is a flowchart of a transmission process according to the first embodiment.
Figure 4:
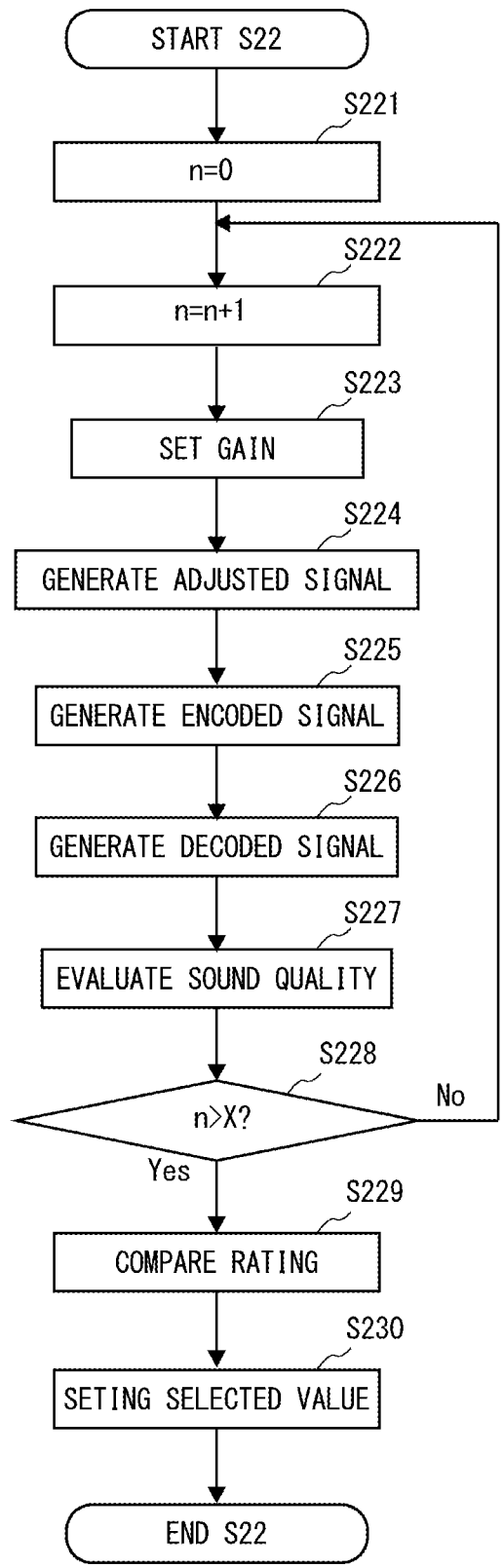
FIG. 4 is a flowchart of a gain setting updating process according to the first embodiment.

Next, with reference to FIGS. 3 and 4, an audio signal controlling method carried out by the wireless communication device 100 according to the present embodiment will be described. FIG. 3 is a flowchart of a transmission process according to the first embodiment.

First, the CPU 14 determines whether the wireless communication device 100 is currently transmitting a user audio signal (step S11). If the CPU 14 has determined that the wireless communication device 100 is currently transmitting a user audio signal (step S11: YES), the DSP 13 acquires the audio signal (step S12), the noise reduction unit 130 carries out a noise reduction process (step S13), and the automatic gain controlling unit 131 makes a level adjustment (step S14). The automatic gain controlling unit 131 supplies the audio signal subjected to the level adjustment to each of the equalizer 132 and the storage unit 15.

Then, the equalizer 132 generates an adjusted signal from the user audio signal subjected to the level adjustment (step S15). In addition, the storage unit 15 stores the user audio signal subjected to the level adjustment (step S16). In other words, when carrying out the process of transmitting a user audio signal, the wireless communication device 100 proceeds with the transmission process and concurrently carries out a process of storing the generated user audio signal into the storage unit 15.

In step S16, the storage unit 15 stores an audio signal corresponding to a preset duration (for example, 5 seconds, 120 seconds, etc.), and when a new audio signal is supplied, the storage unit 15 stores the newly supplied audio signal and deletes the old audio signal. In other words, the storage unit 15 may be, for example, a ring buffer. The audio signal stored in the storage unit 15 may be deleted when the power source of the wireless communication device 100 enters an off state from an on state or when the power source of the wireless communication device 100 enters an on state from an off state. Such a configuration allows any audio signal of a previous user to be deleted when a different user starts using the wireless communication device 100 and allows the audio signal control process to be carried out favorably.

Referring back to step S15, upon the equalizer 132 generating the adjusted signal in step S15, the encoder 133 encodes the adjusted signal to generate an encoded signal (step S17). The encoder 133 supplies the generated encoded signal to the DA converter 16. Then, the DA converter 16 converts the encoded signal to an analog signal, and the transmission circuit 17 carries out the transmission process (step S18).

Then, the CPU 14 determines whether to end the entire process (step S19). For example, when the wireless communication device 100 is powered off, the CPU 14 determines to end the entire process (step S19: YES) and terminates the process. Meanwhile, if the CPU 14 has determined not to end the entire process (step S19: NO), the CPU 14 returns to step S11 and continues with the process.

In step S11, if the CPU 14 has determined that the wireless communication device 100 is currently not transmitting a user audio signal (step S11: NO), the CPU 14 determines whether the wireless communication device 100 is currently receiving a communicating party audio signal (step S20). If the CPU 14 has determined that the wireless communication device 100 is currently receiving a communicating party audio signal (step S20: YES), the CPU 14 returns to step S11 and continues with the process. Meanwhile, if the CPU 14 has determined that the wireless communication device 100 is currently not receiving a communicating party audio signal (step S20: NO), the CPU 14 proceeds to step S21.

Then, the CPU 14 determines whether an audio signal of a predetermined size is stored in the storage unit 15 (step S21). If no audio signal of a predetermined size is stored in the storage unit 15 (step S21: NO), the CPU 14 returns to step S11 and determines again whether the wireless communication device 100 is currently transmitting a user audio signal. Meanwhile, if an audio signal of a predetermined size is stored in the storage unit 15 (step S21: YES), the CPU 14 starts a gain setting updating process (step S22). Specifically, the gain setting updating process is started if the wireless communication device 100 is neither transmitting nor receiving an audio signal and if an audio signal of a predetermined size is stored in the storage unit 15. Details of the gain setting updating process will be described later with reference to FIG. 4. Upon the gain setting updating process being finished, the CPU 14 determines whether to end the entire process (step S19).

Next, the gain setting updating process will be described with reference to FIG. 4. FIG. 4 is a flowchart of the gain setting updating process according to the first embodiment.

Upon the gain setting updating process being started, the CPU 14 first resets a counter value n to 0 (n=0) (step S221). Then, the CPU 14 increments the counter value n by 1 (step S222) and also instructs the updating unit 136 to set the gain of the equalizer 132 corresponding to the counter value n (step S223).

The CPU 14 then supplies a user audio signal stored in the storage unit 15 to the equalizer 132. The equalizer 132 adjusts the frequency characteristics of the user audio signal in accordance with the set gain setting and generates an adjusted signal, or an adjusted audio signal (step S224). The gain setting and the adjusted signal corresponding to the gain setting are associated with the value of the counter set by the CPU 14. Specifically, in an instance of the process in which the value of the counter is n, an adjusted signal corresponding to the counter value n is generated in accordance with the gain setting corresponding to the counter value n. The equalizer 132 supplies the generated adjusted signal to the encoder 133.

The encoder 133 encodes the adjusted signal with a preset scheme (AMBE+2) to generate an encoded signal corresponding to the counter value n (step S225). The encoder 133 supplies the generated encoded signal to the decoder 134.

The decoder 134 decodes the encoded signal to generate a decoded signal corresponding to the counter value n (step S226). The decoder 134 supplies the generated decoded signal to the sound quality evaluating unit 135.

The sound quality evaluating unit 135 receives the decoded signal from the decoder 134 and also the user audio signal from the storage unit 15 and carries out the evaluation, with the PESQ, by comparing the received two audio signals (step S227). The sound quality evaluating unit 135 supplies the evaluation result corresponding to the counter value n to the updating unit 136.

Then, the CPU 14 determines whether the counter value n has exceeded a prescribed value X (step S228). The prescribed value X is a preset value and corresponds to the maximum number of patterns of the gain settings. If the CPU 14 has determined that the counter value n has not exceeded the prescribed value X (step S228: NO), the CPU 14 returns to step S222. In step S222, the CPU 14 increments the counter value n and instructs the updating unit 136 to set the gain of the equalizer 132 corresponding to the incremented counter value.

Meanwhile, if the CPU 14 has determined that the counter value n has exceeded the prescribed value X (step S228: YES), the CPU 14 terminates the sound quality evaluation process and instructs the updating unit 136 to carry out a rating evaluation (step S229). Specifically, the updating unit 136 compares the counter value and a rating associated with the counter value and selects one counter value with a high rating.

Then, the updating unit 136 carries out a setting process of reflecting the gain setting corresponding to the selected one counter value to the register 137 (step S230). Upon the gain setting being updated, the setting updating process is terminated.

Specific examples of the counter value n and the gain setting will now be described. In one specific example, the gain setting can be adjusted in three levels—0 dB, +4 dB, and −4 dB—in each of the five frequency bands, and the evaluation is carried out for every combination of the gain settings in the setting updating process. In this case, since there are 125 patterns of combinations of the gain settings, the counter value n takes a value of from 1 to 125, and the upper limit value X of the counter is set to 125. Each time the counter value n is incremented, the setting of one of the 125 patterns of combinations is reflected to the register 137, and the gain setting is changed. Then, the sound quality evaluating unit 135 carries out the evaluation by comparing each of the decoded signals corresponding to the respective counter values and one user audio signal serving as the source for each of the decoded signals.

Another specific example of the counter value n and the gain setting will now be described. In another specific example, the gain setting has frequency characteristics of preselected patterns. The frequency characteristics of preselected patterns are the frequency characteristics that tend to be employed frequently in actual use. For example, an assumption is that the frequency characteristics that tend to be employed in a language used by user have three patterns: a pattern in which the gain in the high-mid band is raised, a pattern in which the gain in the mid band is raised, and a pattern in which the gain in the mid band and in the high-mid band is raised. In this case, the updating unit 136 stores these three gain settings as patterns for the gain settings associated with a difference in the language. In a similar manner, the updating unit 136 stores five gain settings as patterns that are conceivable from, for example, the age and the gender of the user. For example, when the above-described eight patterns are the preselected patterns, the updating unit 136 associates these eight gain settings to the respective counter values 1 to 8 and evaluates the sound quality while switching the gain setting among these eight combinations. This configuration allows the wireless communication device 100 to complete the sound quality evaluation process more efficiently and quickly.

There is a possibility that a transmission process or a reception process is started while the gain setting updating process described above is being carried out. In such a case, the CPU 14 has a function of introducing an interrupt process during the gain setting updating process and suspending the gain setting updating process. In addition, the CPU 14 has a function of resuming the suspended process when the transmission process or the reception processing that has led to the suspension is finished. This configuration allows the wireless communication device 100 to carry out the process of suppressing a decrease in the sound quality efficiently without interfering with the transmission process and/or the reception process.

Thus far, the first embodiment has been described. For the configuration of the wireless communication device 100 and for the audio signal control process, configurations other than those described above can also be employed. For example, the wireless communication device 100 may carry out the gain setting updating process during the transmission process of a user audio signal. In this case, the CPU 14 may store the user audio signal being transmitted into the storage unit 15, and after an audio signal of a predetermined size has been stored into the storage unit 15, the CPU 14 may carry out the gain setting updating process intermittently so as not to interfere with the process on the audio signal being transmitted. Such a configuration allows the wireless communication device 100 to carry out the gain setting updating process substantially simultaneously as the user transmits an audio signal. Therefore, the wireless communication device 100 can transmit an audio signal with a high sound quality immediately upon the user transmitting an audio signal.

The wireless communication device 100 may be configured not to suspend the gain setting updating process while the reception process is being carried out. In this case, the gain setting updating process may be carried out intermittently so as not to interfere with the reception process, or a decoder for carrying out the gain setting updating process may be provided separately from the decoder 134 for processing a received audio signal. Such a configuration allows the wireless communication device 100 to carry out the gain setting updating process without any lag and to constantly transmit an audio signal with a high sound quality.

The storage unit 15 stores a user audio signal, and the sound quality evaluating unit 135 is configured to use the user audio signal as an audio signal for reference. Alternatively, a prestored audio signal may be used as an audio signal for reference. In this case, the sound quality can be evaluated favorably regardless of whether the sound quality of a user audio signal that is not encoded is appropriate for reference.

Second Embodiment

Next, a second embodiment will be described with reference to FIG. 5. The second embodiment differs from the first embodiment in that a DSP has a voice activity detection (VAD) function. Hereinafter, the second embodiment will be described with features that are common to the first embodiment being omitted as appropriate.

Figure 5:
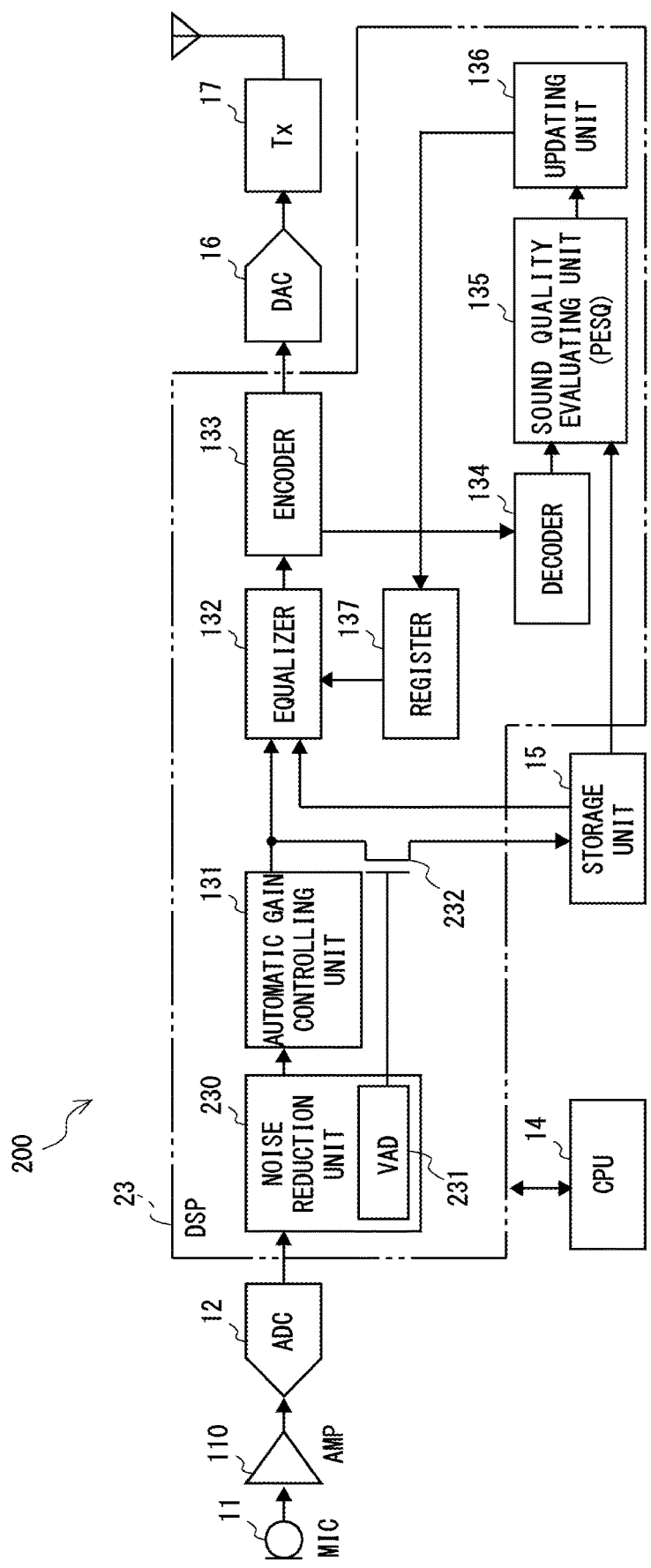
FIG. 5 is a functional block diagram of a wireless communication device according to a second embodiment.

FIG. 5 is a functional block diagram of a wireless communication device according to the second embodiment. A wireless communication device 200 according to the second embodiment includes a DSP 23 in place of the DSP 13. The DSP 23 includes a voice activity detecting unit 231 in a noise reduction unit 230. The voice activity detecting unit 231 detects a soundless segment as part of a function of noise reduction and as such has a function of determining the presence of a sound (determination of a voice activity). The DSP 23 further includes a transistor 232 provided in a communication line connecting the automatic gain controlling unit 131 and the storage unit 15.

The voice activity detecting unit 231 detects, from an input audio signal, a segment in which a sound uttered by the user is present. The voice activity detecting unit 231 is connected to the transistor 232 and is configured to supply the transistor 232 with a signal of a preset voltage (signal H (high)) while a sound uttered by the user is being detected from an input audio signal. In addition, the voice activity detecting unit 231 is configured to supply the transistor 232 with a signal L (low) instead of outputting a signal H while no sound uttered by the user is being detected from an input audio signal.

The transistor 232 is, for example, an n-type metal-oxide-semiconductor field-effect transistor (MOSFET). The transistor 232 serves as a switch that makes a switch between transmitting and refraining from transmitting, to the storage unit 15, an audio signal output from the automatic gain controlling unit 131. In this case, a gate of the transistor 232 is connected to the voice activity detecting unit 231. While the voice activity detecting unit 231 is not detecting any sound uttered by the user, a signal L is being input to the gate of the transistor 232. Therefore, even if an audio signal is input to the DSP 23, this audio signal is not supplied to the storage unit 15. In other words, for example, there may be a state in which the user has turned on the PTT switch but is not speaking. In such a case, the storage unit 15 refrains from storing a new audio signal.

Such a configuration allows the wireless communication device 200 according to the second embodiment to efficiently store an audio signal corresponding to a segment in which the user is speaking. Therefore, the wireless communication device 200 can carry out the gain setting updating process favorably on the basis of an audio signal of a sound uttered by the user.

The transistor 232 described above is an example for implementing the above function, and another configuration may also be employed as long as such a configuration is a circuit that has a switch function of switching between transmitting and refraining from transmitting, to the storage unit 15, an audio signal output from the automatic gain controlling unit 131.

It is to be noted that the present disclosure is not limited to the embodiments described above, and modifications can be made as appropriate within the scope that does not depart from the technical spirit.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution.

A (The) program can be stored and provided to a computer using any type of non-transitory computer readable media. Non-transitory computer readable media include any type of tangible storage media. Examples of non-transitory computer readable media include magnetic storage media (such as floppy disks, magnetic tapes, hard disk drives, etc.), optical magnetic storage media (e.g. magneto-optical disks), CD-ROM (compact disc read only memory), CD-R (compact disc recordable), CD-R/W (compact disc rewritable), and semiconductor memories (such as mask ROM, PROM (programmable ROM), EPROM (erasable PROM), flash ROM, RAM (random access memory), etc.). The program may be provided to a computer using any type of transitory computer readable media. Examples of transitory computer readable media include electric signals, optical signals, and electromagnetic waves. Transitory computer readable media can provide the program to a computer via a wired communication line (e.g. electric wires, and optical fibers) or a wireless communication line.

The first and second embodiments can be combined as desirable by one of ordinary skill in the art.

What is claimed is:

1. A wireless communication device configured to perform transmission of a user audio signal and reception of a communicating party audio signal, the wireless communication device comprising:
   an equalizer configured to adjust a frequency characteristic of the user audio signal on the basis of a predetermined gain setting and to generate an adjusted signal, the adjusted signal being an adjusted audio signal;
   an encoder configured to encode the adjusted signal with a preset scheme to generate an encoded signal;
   a decoder configured to decode the encoded signal to generate a decoded signal;
   a sound quality evaluator configured to carry out a perceptual evaluation of speech quality (PESQ) evaluation of the decoded signal and to generate an evaluation result with the user audio signal serving as a reference signal for evaluation; and
   a selector configured to change the gain setting and to select a gain setting yielding a high evaluation result.

2. The wireless communication device according to claim 1, further comprising:
   a storage circuit configured to store the user audio signal,
   wherein the sound quality evaluator carries out the PESQ evaluation of the decoded signal with the user audio signal stored in the storage circuit serving as the reference signal for evaluation.

3. The wireless communication device according to claim 2, further comprising:
   a central processing unit (CPU) configured to instruct that a series of processes carried out by the equalizer, the encoder, the decoder, the sound quality evaluator, and the selector for changing the gain setting be started when the wireless communication device is not performing at least either one of the transmission and the reception.

4. The wireless communication device according to claim 3, wherein the CPU suspends the series of processes when the reception is started and resumes the series of processes after the reception is finished.

5. The wireless communication device according to claim 4, further comprising:
   a voice activity detecting circuit configured to detect a sound from the user audio signal,
   wherein the storage circuit stores the user audio signal when the voice activity detecting circuit has detected the sound.

6. The wireless communication device according to claim 3, further comprising:
   a voice activity detecting circuit configured to detect a sound from the user audio signal,
   wherein the storage circuit stores the user audio signal when the voice activity detecting circuit has detected the sound.

7. The wireless communication device according to claim 2, further comprising:
   a voice activity detecting circuit configured to detect a sound from the user audio signal,
   wherein the storage circuit stores the user audio signal when the voice activity detecting circuit has detected the sound.

8. An audio signal controlling method for a wireless communication device configured to perform transmission of a user audio signal and reception of a communicating party audio signal, the audio signal controlling method comprising:

an adjusted signal generating step of adjusting a frequency characteristic of the user audio signal on the basis of a predetermined gain setting and generating an adjusted signal, the adjusted signal being an adjusted audio signal;

an encoding step of encoding the adjusted signal with a preset scheme to generate an encoded signal;

a decoding step of decoding the encoded signal to generate a decoded signal;

a sound quality evaluating step of carrying out a PESQ evaluation of the decoded signal and generating an evaluation result with the user audio signal serving as a reference signal for evaluation; and an updating step of changing the gain setting and selecting a gain setting yielding a high evaluation result.

9. A non-transitory computer-readable storage medium storing a program that causes a computer to execute an audio signal controlling method for a wireless communication device configured to perform transmission of a user audio signal and reception of a communicating party audio signal, the program comprising:

an adjusted signal generating step of adjusting a frequency characteristic of the user audio signal on the basis of a predetermined gain setting and generating an adjusted signal, the adjusted signal being an adjusted audio signal;

an encoding step of encoding the adjusted signal with a preset scheme to generate an encoded signal;

a decoding step of decoding the encoded signal to generate a decoded signal;

a sound quality evaluating step of carrying out a PESQ evaluation of the decoded signal and generating an evaluation result with the user audio signal serving as a reference signal for evaluation; and an updating step of changing the gain setting and selecting a gain setting yielding a high evaluation result.

* * * * *